United States Patent
Chen et al.

(10) Patent No.: US 12,191,174 B2
(45) Date of Patent: Jan. 7, 2025

(54) SEMICONDUCTOR PROCESSING TOOL AND METHOD OF USING AN EMBEDDED CHAMBER

(71) Applicant: Taiwan Semiconductor Manufacturing Co., Ltd., Hsinchu (TW)

(72) Inventors: Chia-Cheng Chen, Hsinchu (TW); Chih-Kai Yang, Taipei (TW); Chun-Liang Chen, Hsinchu (TW); Wei-Ting Chien, Hsinchu (TW); Liang-Yin Chen, Hsinchu (TW); Huicheng Chang, Tainan (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 299 days.

(21) Appl. No.: 17/720,807

(22) Filed: Apr. 14, 2022

(65) Prior Publication Data
US 2022/0406629 A1 Dec. 22, 2022

Related U.S. Application Data

(60) Provisional application No. 63/212,176, filed on Jun. 18, 2021.

(51) Int. Cl.
*H01L 21/67* (2006.01)
*G03F 7/40* (2006.01)

(52) U.S. Cl.
CPC ........ *H01L 21/67196* (2013.01); *G03F 7/40* (2013.01); *H01L 21/67201* (2013.01); *H01L 21/67063* (2013.01); *H01L 21/67213* (2013.01); *H01L 21/67225* (2013.01)

(58) Field of Classification Search
None
See application file for complete search history.

(56) References Cited

U.S. PATENT DOCUMENTS

| | | | |
|---|---|---|---|
| 6,987,272 B2 | 1/2006 | Ota et al. | |
| 7,361,605 B2 | 4/2008 | Savas et al. | |
| 2001/0038958 A1* | 11/2001 | Imai | G03F 7/708 |
| | | | 430/30 |
| 2014/0273406 A1* | 9/2014 | Wang | H01L 21/3105 |
| | | | 156/345.31 |
| 2022/0390847 A1* | 12/2022 | Dai | G03F 7/168 |

* cited by examiner

*Primary Examiner* — Shamim Ahmed
(74) *Attorney, Agent, or Firm* — Slater Matsil, LLP

(57) ABSTRACT

In an embodiment, a pattern transfer processing chamber includes a pattern transfer processing chamber and a loading area external to the pattern transfer processing chamber. The loading area is configured to transfer a wafer to or from the pattern transfer processing chamber. The loading area comprises a first region including a loadport, a second region including a load-lock between the first region and the pattern transfer processing chamber, and an embedded baking chamber configured to heat a patterned photoresist on the wafer.

20 Claims, 14 Drawing Sheets

| Implanter | 1 | 2 | 3 |
|---|---|---|---|
| Pre-baking | v | v | |
| Post-baking | | v | v |

Figure 5A

| Etcher | 1 | 2 | 3 |
|---|---|---|---|
| Pre-baking | v | v | |
| Post-baking | | v | v |

Figure 5B

SEMICONDUCTOR PROCESSING TOOL AND METHOD OF USING AN EMBEDDED CHAMBER

PRIORITY CLAIM AND CROSS-REFERENCE

This application claims the benefit of U.S. Provisional Application No. 63/212,176, filed on Jun. 18, 2021, which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies.

The reduction in feature size in semiconductor devices has increased the need for more reliable quality control. One aspect subject to quality control is that stability of the patterned photoresist is crucial to control the quality of image transfer (e.g., transfer of the photoresist's pattern through etching and/or implantation operations). The quality of the image transfer may be measured in terms of resolution of pitch, defects, wafer-to-wafer variation of the critical dimension (CD), lot-to-lot variation of CD, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A and 5B show possible combinations of pre-baking and post-baking techniques, in accordance to some embodiments.

DETAILED DESCRIPTION

Figure 1A:
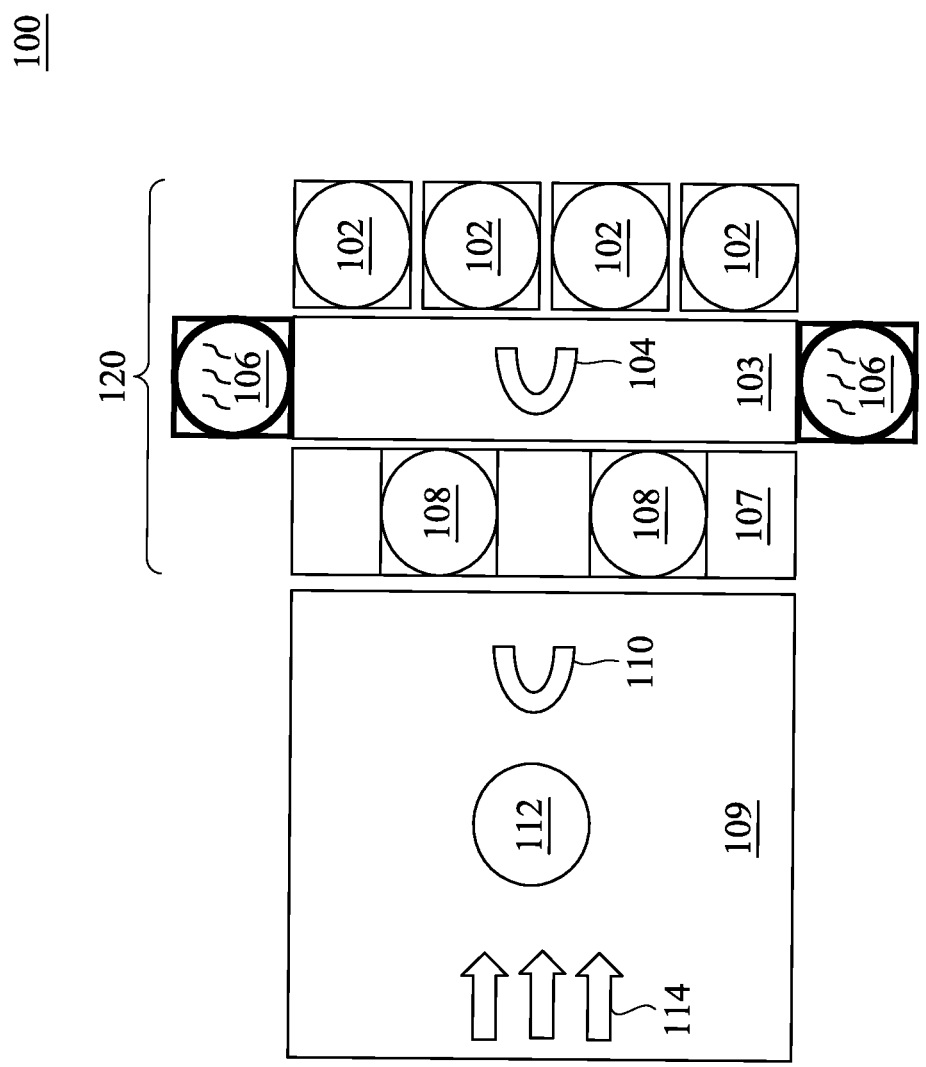
FIG. 1A illustrates a schematic view of a semiconductor processing tool, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide embedded baking chambers installed in pattern transfer tools (e.g., an etching tool, an implantation tool, or the like) to stabilize (e.g., harden) a patterned photoresist. Further, the embodiment pattern transfer tools solve the degraded image quality issue caused by rehydration of the photoresist (e.g., poor pattern definition resulting in manufacturing defects). The rehydration of the photoresist could occur during the queue time between the post development (e.g., after the photoresist pattern development, such as post development baking (PDB)) of the patterned photoresist and the subsequent pattern transferring process when the queue time is relatively long.

FIG. 1A illustrates a schematic view of a semiconductor processing tool 100, in accordance with some embodiments. The semiconductor processing tool 100 may be an etching tool, an implantation tool, or the like that transfers (e.g., etches, implants, or the like) a pattern of a patterned photoresist to an underlying layer of the semiconductor device. The semiconductor processing tool 100 includes a pattern transfer processing chamber 109 and a load area 120. If the semiconductor processing tool 100 is an implantation tool, the pattern transfer processing chamber 109 may be an implantation processing chamber that, for example, is configured to implant dopants into regions of the underlying layer exposed by the patterned photoresist. If the semiconductor processing tool 100 is an etching tool, the pattern transfer processing chamber 109 may be an etching processing chamber that, for example, is configured to etch regions of the underlying layer exposed by the patterned photoresist. The pattern transfer processing chamber 109 may be kept in vacuum (e.g., between about $10^{-5}$ torr and about $10^{-6}$ torr) and include a platen 112 and vacuum robots 110. The load area 120 may include loadports 102, embedded baking chambers 106, and a handling system 103. The loadports 102, the embedded baking chambers 106, and the handling system 103 may be in an atmosphere (ATM) space of the semiconductor processing tool 100. The load area 120 of the semiconductor processing tool 100 may further include a load-lock system 107 having one or more load-locks 108, which may be used to transfer workpieces from the atmosphere space of the loadports 102/embedded baking chambers 106 to a vacuum environment of the pattern transfer processing chamber 109. The load-lock 108 may include an inlet (not shown). The load-lock 108 may further include a vacuum pump (not shown) connected to an outlet (not shown) of the load-lock 108. To achieve a desired chamber pressure (e.g., the ATM pressure), the load-lock 118 may use the inlet to flow air into the chamber of the load-lock 108. The load-lock 108 may also use the vacuum pump to remove air for achieving the desired vacuum level for the load-lock 108.

A loadport 102 may include a front open unified pod (FOUP) (not shown), which is a plastic enclosure designed to hold workpieces (e.g., semiconductor wafers, semiconductor substrates, flat panels, or the like) securely and safely in a controlled environment, and to allow the workpieces to be transferred between tools for processing. Each workpiece of the workpieces stored in the FOUP on the loadport 102 may include device layers and a patterned photoresist on the device layers. The photoresist may have been deposited and patterned by a photolithography tool over a device layer of the workpiece before the workpiece arrives at the loadport 102. The loadports 102 may feed workpieces stored in the FOUPs to ATM robots 104 of the handling system 103. The ATM robots 104 may put the workpieces from the loadports 102 to the embedded baking chambers 106.

An embedded baking chamber 106 is a chamber that may be closed for heating (e.g., baking) a workpiece (including the patterned photoresist on the workpiece). In some embodiments, the embedded baking chamber 106 may include a hot plate (not shown) having a resistance heating element. A workpiece placed on the hot plate may be heated by the resistance heating element. In some other embodiments, the embedded baking chamber 106 may include a halogen lamp (not shown) that illuminates and heats the workpiece that is placed in the embedded baking chamber 106.

The embedded baking chamber 106 may heat the workpiece (including the photoresist on the workpiece) for the duration between 5 seconds and 30 minutes. Further, the embedded baking chamber 106 may heat the workpiece at a temperature between 70° C. and a glass transition temperature ($T_g$) of the photoresist on the workpiece. The glass transition temperature ($T_g$) may be at most 150° C. Moreover, the embedded baking chamber 106 may heat the workpiece in an ambient environment of clean dry air. After the workpiece is heated (e.g., after the heating duration of 5 seconds to 30 minutes), the workpiece may then be cooled down to the room temperature in the embedded baking chamber 106.

After the workpiece is cooled down, the ATM robot 104 may move the workpiece from the embedded baking chamber 106 to a load-lock 108 of the load-lock system 107. The loading amount of the embedded baking chamber 106 may be a single workpiece type (e.g., a single wafer type) or a batch type (e.g., the embedded baking chamber 106 can load a shelf of wafers). In some embodiments, the loading amount of an embedded baking chamber 106 may be the same as the loading amount of a load-lock 108 to minimize the impact on the production throughput. The load-lock system 107 may include a plurality of load-locks 108. In some embodiments, the number of the plurality of load-locks 108 may be the same as the number of the embedded baking chambers 106.

After the ATM robot 104 moves the workpiece from the embedded baking chamber 106 to the load-lock 108, the load-lock 108 may then be evacuated to the desired vacuum level using the vacuum pump. In some embodiments, the vacuum level for the load-lock 108 may be between about $10^{-5}$ torr and about $10^{-6}$ torr if the pattern transfer processing chamber 109 is an implantation processing chamber. In some embodiments, the vacuum level for the load-lock 108 may be between about $10^{-3}$ torr and about $10^{-4}$ torr if the pattern transfer processing chamber 109 is an etching processing chamber for dry etching. Next, the door to the pattern transfer processing chamber 109 may be opened to remove a previously processed workpiece and permit loading of the new workpiece from the load-lock 108. A vacuum robot 110 in the pattern transfer processing chamber 109 may move the workpiece from the load-lock 108 and place the workpiece on a platen 112 in the pattern transfer processing chamber 109, after which the door is closed and the workpiece is processed for pattern transfer (e.g., etching or implantation). The platen 112 may support the workpiece at an appropriate angle within the pattern transfer processing chamber 109 for pattern transfer operations by the ion beam 114.

After the pattern transfer operations complete, the workpiece may be removed from the pattern transfer processing chamber 109 by a vacuum robot 110 and placed into a load-lock 108 when the load-lock 108 is under vacuum. The load-lock 108 may then be re-pressurized (e.g. vented) to the atmospheric pressure, and the workpieces in the load-lock 108 may be removed from the load-lock 108 by the ATM robots 104. The ATM robots 104 may then place the workpieces into the FOUPS on the loadports 102, where the workpieces are ready to move to the next production step.

Figure 1B:
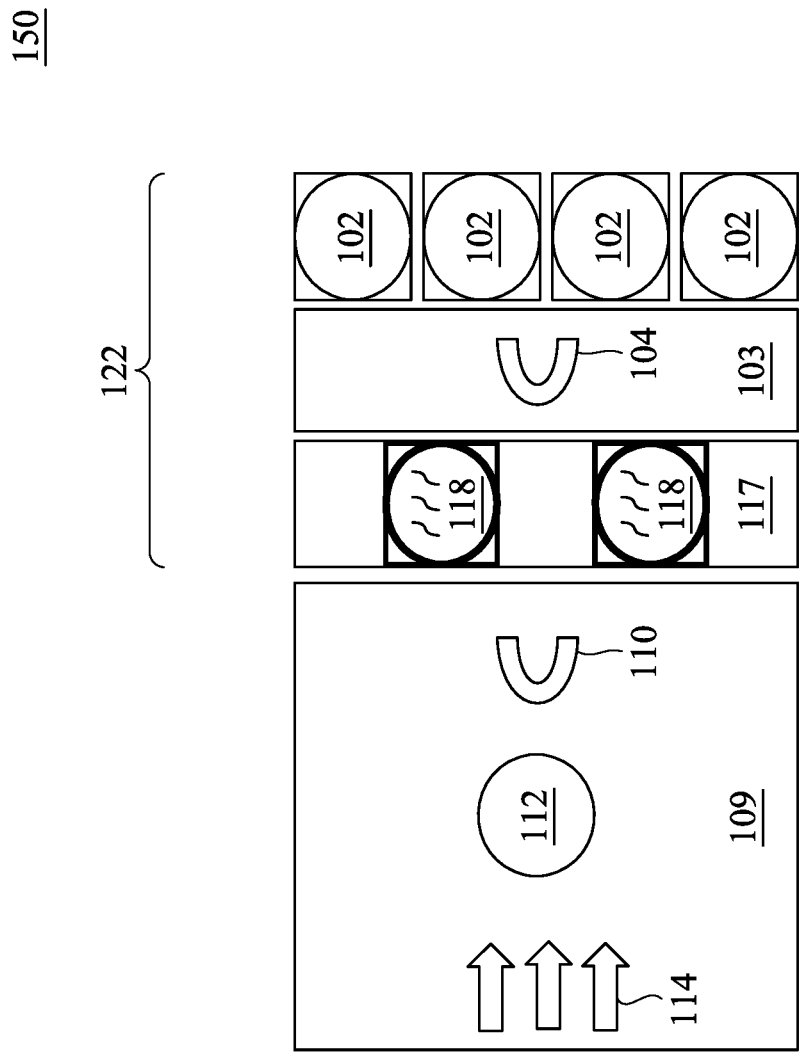
FIG. 1B illustrates a schematic view of a semiconductor processing tool, in accordance with some embodiments.

FIG. 1A shows a semiconductor processing tool 100 with an installation option of the embedded baking chambers 106 in the ATM space of the load area 120, prior to load-locks 108 or the vacuum region for the pattern transfer processing chamber 109. FIG. 1B shows a semiconductor processing tool 150 with another installation option of the embedded baking chambers in the load area 120 prior to the vacuum region for the pattern transfer processing chamber 109, where the embedded baking chambers are integrated into the load-locks.

Referring to FIG. 1B, which illustrates a schematic view of a semiconductor processing tool 150, in accordance with some embodiments. The semiconductor processing tool 150 may be an etching tool, an implantation tool, or the like that transfers (e.g., etches, implants, or the like) a pattern of a patterned photoresist to an underlying layer of the semiconductor device. The semiconductor processing tool 150 includes a pattern transfer processing chamber 109 and a load area 122. If the semiconductor processing tool 150 is an implantation tool, the pattern transfer processing chamber 109 may be an implantation processing chamber that, for example, is configured to implant dopants into regions of the underlying layer exposed by the patterned photoresist. If the semiconductor processing tool 150 is an etching tool, the pattern transfer processing chamber 109 may be an etching processing chamber that, for example, is configured to etch regions of the underlying layer exposed by the patterned photoresist. The pattern transfer processing chamber 109 may be kept in vacuum (e.g., between about $10^{-5}$ torr and about $10^{-6}$ torr) and include a platen 112 and vacuum robots 110. The load area 122 may include loadports 102 and a handling system 103. The loadports 102 and the handling system 103 may be in the ATM space of the semiconductor processing tool 150. The load area 122 of the semiconductor processing tool 150 may further include a load-lock system 117 having one or more load-locks 118, which may be used to transfer workpieces from the atmosphere space of the loadports 102 to a vacuum environment of the pattern transfer processing chamber 109.

A loadports 102 may include a front open unified pod (FOUP) (not shown), which is a plastic enclosure designed to hold workpieces (e.g., semiconductor wafers, semiconductor substrates, flat panels, or the like) securely and safely in a controlled environment, and to allow the workpieces to be transferred between tools for processing. Each workpiece of the workpieces stored in the FOUP on the loadport 102 may include device layers and a patterned photoresist on the device layers. The photoresist may have been deposited and patterned by a photolithography tool over a device layer of the workpiece before the workpieces arrives at the loadports 102. The loadports 102 may feed workpieces stored in the FOUPs to ATM robots 104 of the handling system 103. The ATM robots 104 may put the workpieces from the loadports 102 to the load-locks 118 in the load-lock system 117.

The loading amount of the embedded baking chamber of a load-lock 118 may be a single workpiece type (e.g., a single wafer type) or a batch type (e.g., the embedded baking chamber of the load-lock 118 can load a shelf of wafers). In some embodiments, the loading amount of the embedded baking chamber of the load-lock 118 may be the same as the loading amount of a load-lock 108 as described with respect to FIG. 1A to minimize the impact on the production throughput.

A load-lock (with the embedded baking chamber) 118 is an enclosed chamber for heating the patterned photoresist on the workpiece. In some embodiments, the embedded baking chamber of the load-lock 118 may include a hot plate (not shown) having a resistance heating element. A workpiece placed on the hot plate may be heated by the resistance heating element. In some other embodiments, the embedded baking chamber of the load-lock 118 may include a halogen lamp (not shown) that illuminates and heats the workpiece that is placed in the embedded baking chamber of the load-lock 118.

The embedded baking chamber of the load-lock 118 may heat the workpiece (including the photoresist on the workpiece) for the duration between 5 seconds and 30 minutes. Further, the embedded baking chamber of the load-lock 118 may heat the workpiece at a temperature between 70° C. and a glass transition temperature ($T_g$) of the photoresist on the workpiece. The glass transition temperature ($T_g$) may be at most 150° C. Moreover, the embedded baking chamber of the load-lock 118 may heat the workpiece in an ambient environment of clean dry air, $N_2$, or an inert gas (e.g., He, Ne, Ar, the like, or combinations thereof) with the atmosphere (ATM) pressure. In some other embodiments, the embedded baking chamber of the load-lock 118 may heat the workpiece in vacuum or with a pressure lower than the ATM pressure. The load-lock 118 may include an inlet (not shown). The load-lock 108 may further include a vacuum pump (not shown) connected to an outlet (not shown) of the load-lock 108. To achieve a desired chamber pressure (e.g., the ATM pressure), the load-lock 118 may use the inlet to flow one or more of these gases from a gas supply source into the embedded baking chamber. The load-lock 118 may also use the vacuum pump to remove these gases for achieving the desired vacuum level for the load-lock 118. After the workpiece is heated (e.g., after the heating duration of 5 seconds to 30 minutes), the workpiece may then be cooled down to the room temperature in the embedded baking chamber of the load-lock 118.

After the workpiece is cooled down, the load-lock 118 may be evacuated to the desired vacuum level using the vacuum pump. In some embodiments, the vacuum level for the load-lock 118 may be between about $10^{-5}$ torr and about $10^{-6}$ torr if the pattern transfer processing chamber 109 is an implantation processing chamber. The vacuum level for the load-lock 118 may be between about $10^{-3}$ torr to about $10^{-4}$ torr if the pattern transfer processing chamber 109 is an etching processing chamber for dry etching. Next, the door to the pattern transfer processing chamber 109 may be opened to remove a previously processed workpiece and permit loading of the new workpiece from the load-lock 118. A vacuum robot 110 in the pattern transfer processing chamber 109 may move the workpiece from the load-lock 118 and place the workpiece on a platen 112 in the pattern transfer processing chamber 109, after which the door is closed and the workpiece is processed for pattern transferring process (e.g., etching and/or implantation). The platen 112 may support the workpiece at an appropriate angle within the pattern transfer processing chamber 109 for pattern transfer operations by the ion beam 114.

After the pattern transfer operations complete, the completed workpiece may be removed from the pattern transfer processing chamber 109 by a vacuum robot 110 and placed into a load-lock 118 when the load-lock 118 is under vacuum. The load-lock 118 may then be re-pressurized (e.g. vented) to the atmospheric pressure, and the workpieces may be removed from the load-lock 118 by the ATM robots 104. The ATM robots 104 may then place the workpieces into the FOUPS on the loadports 102, where the workpieces are ready to move to the next production step.

Figure 2A:
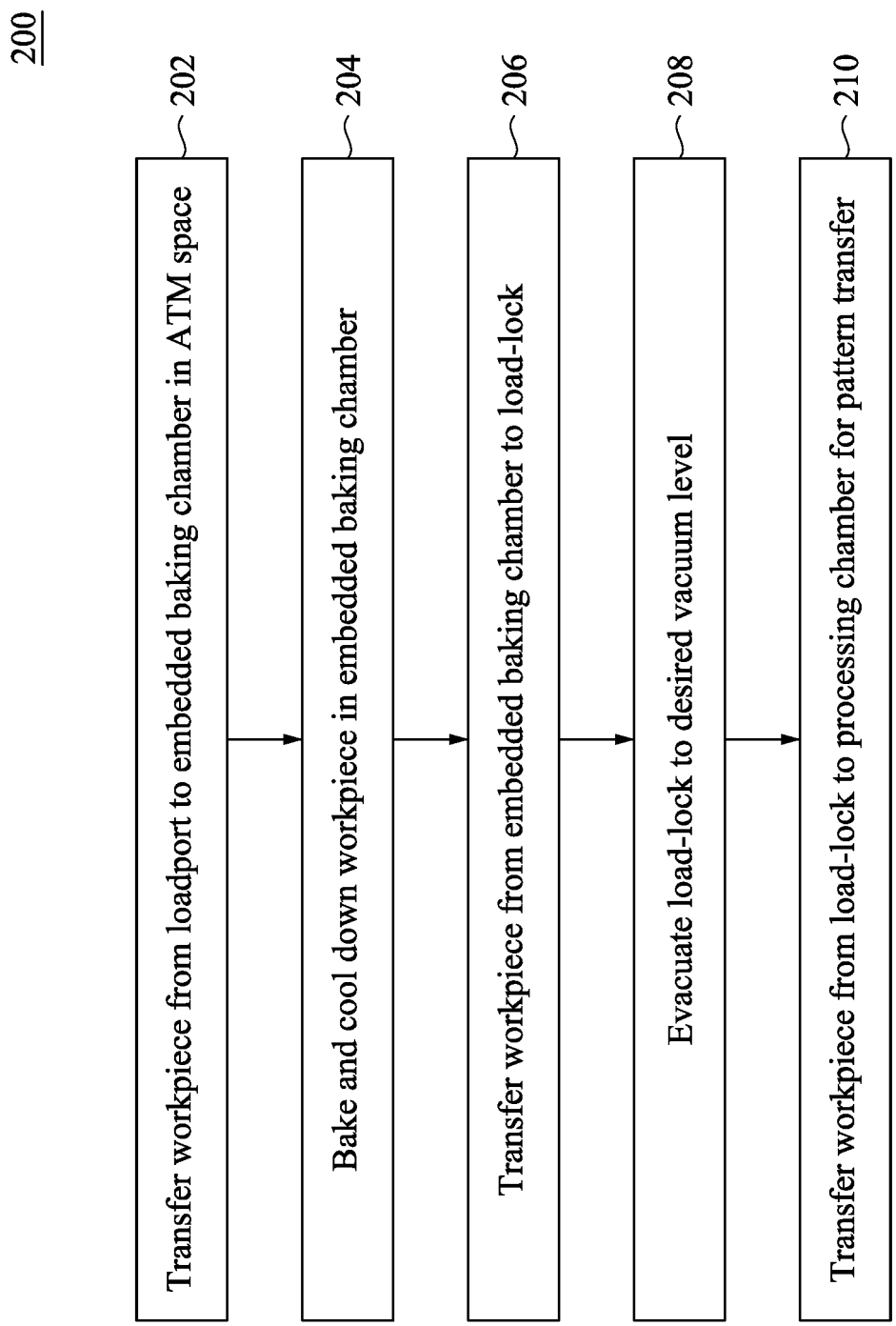
FIG. 2A illustrates a flow chart of a method of embedded baking for pre-baking, in accordance with some embodiments.

FIG. 2A illustrates a flow chart of a method 200 for embedded baking, in accordance with some embodiments. The method 200 may be performed using the semiconductor processing tool 100 described with respect to FIG. 1A. It should be understood that the embodiment method 200 shown in FIG. 2A is merely an example of many possible embodiment methods. For example, various steps as illustrated in FIG. 2A may be added, removed, replaced, rearranged, and repeated.

In step 202, a workpiece (e.g., a semiconductor wafer or a semiconductor substrate or a flat panel) may be transferred from a loadport 102 to an embedded baking chamber 106 in the ATM space. The workpiece may be transferred by the ATM robot 104 from the loadport 102 to the embedded baking chamber 106.

In step 204, the embedded baking chamber 106 may heat the workpiece for the duration between 5 seconds and 30 minutes. The embedded baking chamber 106 may heat the workpiece at a temperature between 70° C. and a glass transition temperature ($T_g$) of the photoresist on the workpiece. The glass transition temperature ($T_g$) may be at most 150° C. The embedded baking chamber 106 may also heat the workpiece in an ambient environment of clean dry air with an atmosphere (ATM) pressure. Heating the workpiece may harden the patterned photoresist on the workpiece to improve stability of the pattern definition, which reduces manufacturing defects for the subsequent pattern transferring process. After the workpiece is heated (e.g., after the heating duration of 5 seconds to 30 minutes), the workpiece may then be cooled down to the room temperature.

In step 206, the workpiece may be transferred from the embedded baking chamber 106 in the ATM space to a load-lock 108. The workpiece may be transferred from the embedded baking chamber 106 to the load-lock 108 by the ATM robot 104.

In step 208, the load-lock 108 may be evacuated to a desired vacuum level. In some embodiments, if the pattern transfer processing chamber 109 is an etching processing chamber for dry etching, the vacuum level for the load-lock 108 may range from about $10^{-3}$ torr to about $10^{-4}$ torr. If the pattern transfer processing chamber 109 is an implantation processing chamber, the vacuum level for the load-lock 108 may range from about $10^{-5}$ torr to about $10^{-6}$ torr.

In step 210, the workpiece may be transferred from the load-lock 108 to the pattern transfer processing chamber 109. In some embodiments, a vacuum robot 110 in the pattern transfer processing chamber 109 may transfer the workpiece from the load-lock 108 and place the workpiece on the platen 112 in the pattern transfer processing chamber 109. Then, the pattern transfer processing chamber 109 may perform pattern transfer operations (e.g., etching, implantation, or the like) on the workpiece to transfer the pattern of the patterned photoresist to an underlying layer of the semiconductor device. For example, the workpiece may be exposed to the ion beam 114 for implantation or certain types of etching. Because the pattern of the patterned photoresist has been stabilized by the heating in step 204, the high pattern definition of the patterned photoresist results in improved quality of the pattern of the patterned photoresist being transferred to the underlying layer of the semiconductor device.

Figure 2B:
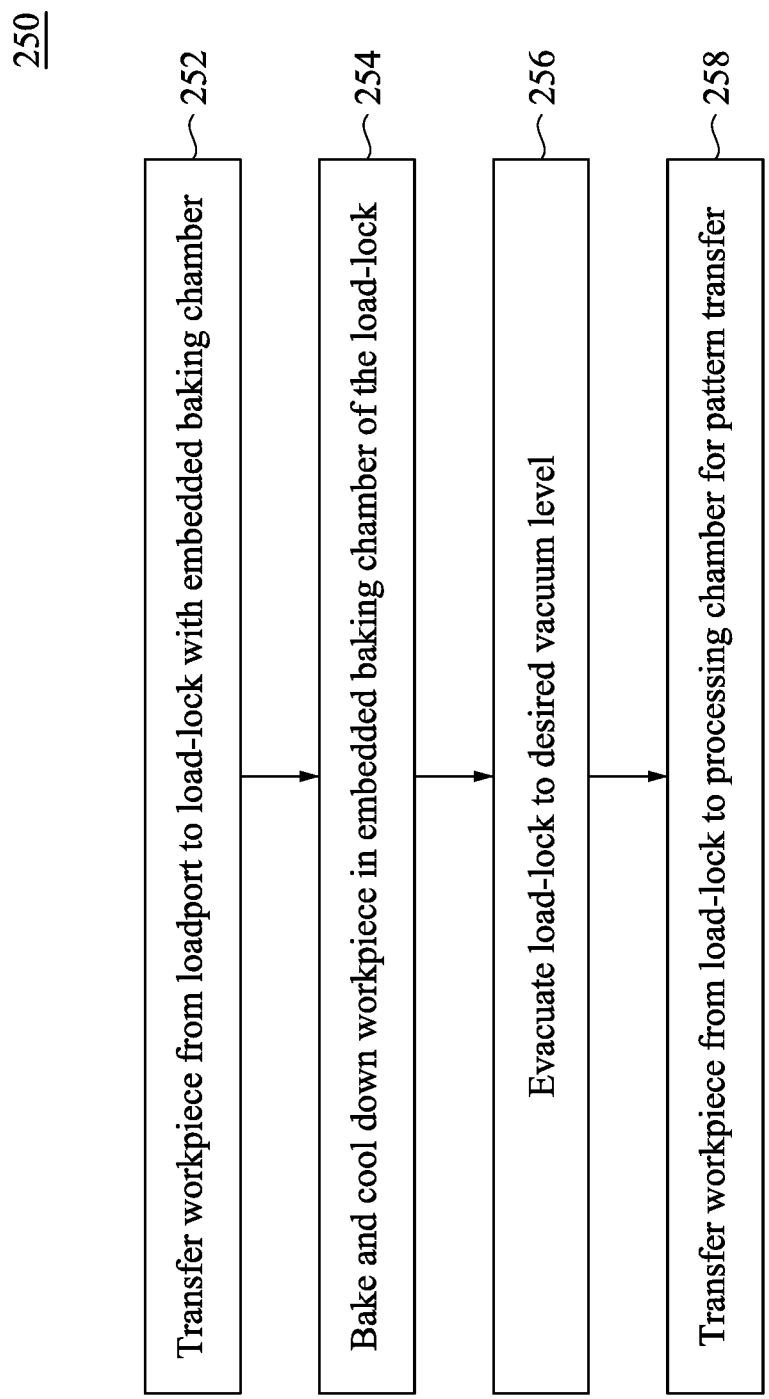
FIG. 2B illustrates a flow chart of a method of embedded baking for pre-baking, in accordance with some embodiments.

FIG. 2B illustrates a flow chart of a method 250 for embedded baking, in accordance with some embodiments. The method 250 may be performed using the semiconductor processing tool 150 described with respect to FIG. 1B. It should be understood that the embodiment method 250 shown in FIG. 2B is merely an example of many possible embodiment methods. For example, various steps as illustrated in FIG. 2B may be added, removed, replaced, rearranged, and repeated.

In step 252, a workpiece (e.g., a semiconductor wafer or a semiconductor substrate or a flat panel) may be transferred from a loadport 102 to a load-lock 118 with an embedded baking chamber. The workpiece may be transferred by the ATM robot 104 from the loadport 102 to the load-lock 118.

In step 254, the embedded baking chamber of the load-lock 118 may heat the workpiece for the duration between 5 seconds and 30 minutes. The embedded baking chamber of the load-lock 118 may heat the workpiece at a temperature between 70° C. and a glass transition temperature ($T_g$) of the photoresist on the workpiece. The glass transition temperature ($T_g$) may be at most 150° C. The embedded baking chamber of the load-lock 118 may also heat the workpiece in an ambient environment of clean dry air, $N_2$, or an inert gas (e.g., He, Ne, Ar, the like, or combinations thereof) with an atmosphere (ATM) pressure. Heating the workpiece may harden the patterned photoresist on the workpiece to improve stability of the pattern definition, which reduces manufacturing defects for the subsequent pattern transferring process. After the workpiece is heated (e.g., after the heating duration of 5 seconds to 30 minutes), the workpiece may then be cooled down to the room temperature.

In step 256, the load-lock 118 may be evacuated to a desired vacuum level. In some embodiments, if the pattern transfer processing chamber 109 is an etching processing chamber for dry etching, the vacuum level for the load-lock 118 may range from about $10^{-3}$ torr to about $10^{-4}$ torr. If the pattern transfer processing chamber 109 is an implantation processing chamber, the vacuum level for the load-lock 118 may range from about $10^{-5}$ torr to about $10^{-6}$ torr.

In step 258, the workpiece may be transferred from the load-lock 118 to the pattern transfer processing chamber 109. In some embodiments, a vacuum robot 110 in the pattern transfer processing chamber 109 may transfer the workpiece from the load-lock 118 and place the workpiece on the platen 112 in the pattern transfer processing chamber 109. Then, the pattern transfer processing chamber 109 may perform pattern transfer operations (e.g., etching, implantation, or the like) on the workpiece to transfer the pattern of the patterned photoresist to an underlying layer of the semiconductor device. For example, the workpiece may be exposed to the ion beam 114 for implantation or certain types of etching. Because the pattern of the patterned photoresist has been stabilized by the heating in step 254, the high pattern definition of the patterned photoresist results in improved quality of the pattern of the patterned photoresist being transferred to the underlying layer of the semiconductor device. Further, by applying a hardening process (e.g., heating) only a short time frame (e.g., at most 30 minutes) prior to the pattern transferring process, the patterned photoresist may not have an opportunity to soften (e.g. as a result of moisture absorption) between the hardening process and the pattern transferring process. It has been observed that by limiting the time frame between the annealing process and a pattern transferring process to no more than 30 minutes, softening of the photoresist may be avoided, and manufacturing defects are advantageously reduced.

FIGS. 2A and 2B described above illustrate embodiments of using an embedded baking chamber of a semiconductor processing tool (described with respect to FIGS. 1A and 1B) to heat the workpiece prior to the workpiece being transferred to the pattern transfer processing chamber 109 of the semiconductor processing tool 100 or 150 for pattern transfer operations (e.g., pre-baking). In so doing in these pre-baking embodiments, the patterned photoresist on a workpiece can be stabilized by the embedded baking chamber installed in an implantation tool or an etching tool right before etching in the etching process chamber or before implantation in the implantation processing chamber to mitigate the queue time concern, where rehydration of the patterned photoresist could degrade the image quality.

Figure 3A:
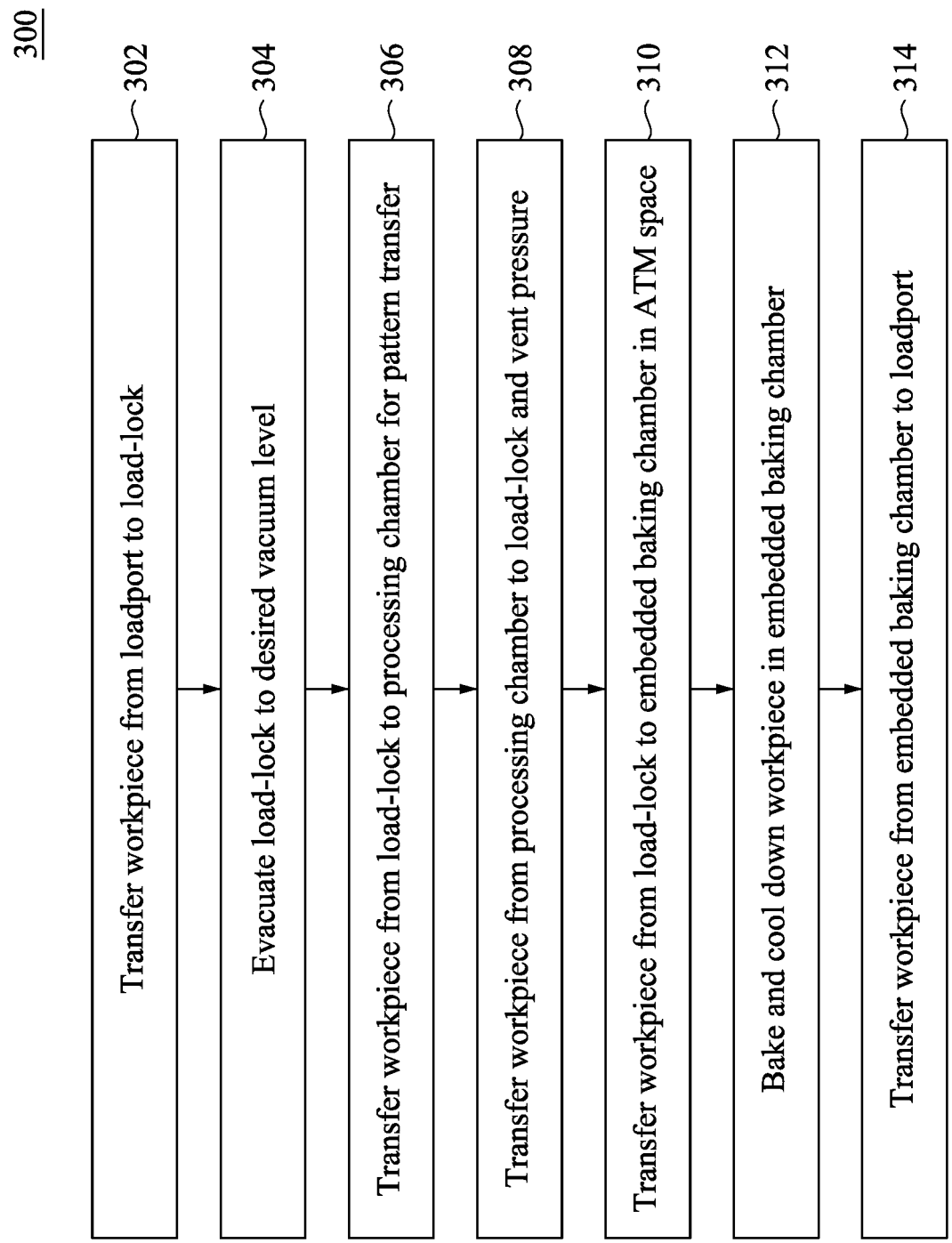
FIG. 3A illustrates a flow chart of a method of embedded baking for post-baking, in accordance with some embodiments.
Figure 3B:
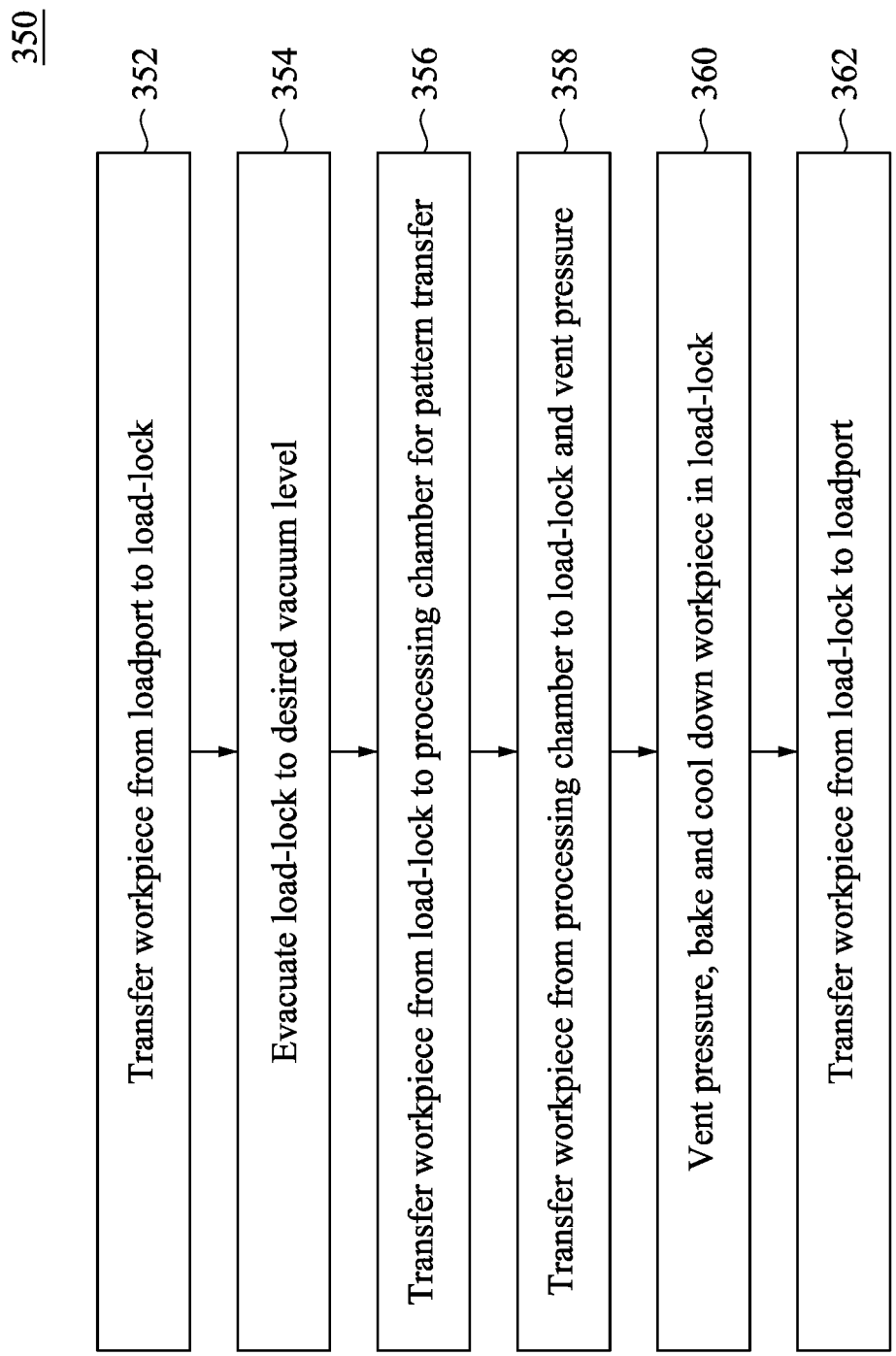
FIG. 3B illustrates a flow chart of a method of embedded baking for post-baking, in accordance with some embodiments.

In other embodiments, the embedded baking chamber of the semiconductor processing tool described with respect to FIGS. 1A and 1B may be used to heat the workpiece after the pattern transfer operations (e.g., post-baking) to mitigate the queue time concern, as illustrated in FIGS. 3A and 3B below.

FIG. 3A illustrates a flow chart of a method 300 of post-baking for embedded baking, in accordance with some embodiments. The method 300 may be performed using the semiconductor processing tool 100 described with respect to FIG. 1A. It should be understood that the embodiment method 300 shown in FIG. 3A is merely an example of many possible embodiment methods. For example, various steps as illustrated in FIG. 3A may be added, removed, replaced, rearranged, and repeated.

In step 302, a workpiece (e.g., a semiconductor wafer or a semiconductor substrate or a flat panel) may be transferred from a loadport 102 to a load-lock 108. The workpiece may be transferred by the ATM robot 104 from the loadport 102 to the load-lock 108.

In step 304, the load-lock 108 may be evacuated to a desired vacuum level. In some embodiments, if the pattern transfer processing chamber 109 is an etching processing chamber for dry etching, the vacuum level for the load-lock 108 may range from about $10^{-3}$ torr to about $10^{-4}$ torr. If the pattern transfer processing chamber 109 is an implantation processing chamber, the vacuum level for the load-lock 108 may range from about $10^{-5}$ torr to about $10^{-6}$ torr.

In step 306, the workpiece may be transferred from the load-lock 108 to the pattern transfer processing chamber 109. In some embodiments, a vacuum robot 110 in the pattern transfer processing chamber 109 may transfer the workpiece from the load-lock 108 and place the workpiece on the platen 112 in the pattern transfer processing chamber 109. Then, the pattern transfer processing chamber 109 may perform pattern transfer operations (e.g., etching, implantation, or the like) on the workpiece to transfer the pattern of the patterned photoresist to an underlying layer of the semiconductor device. For example, the workpiece may be exposed to the ion beam 114 for implantation or certain types of etching.

After the pattern transfer operations, in step 308, the workpiece may be transferred from the pattern transfer processing chamber 109 to a load-lock 108. In some embodiments, a vacuum robot 110 in the pattern transfer processing chamber 109 may transfer the workpiece from the pattern transfer processing chamber 109 to the load-lock 108. The load-lock 108 may then be vented to the ATM pressure.

In step 310, the workpiece may be transferred from the load-lock 108 to an embedded baking chamber 106 in the ATM space. In some embodiments, an ATM robot 104 in the ATM space may transfer the workpiece from the load-lock 108 to the embedded baking chamber 106.

In step 312, the embedded baking chamber 106 may heat the workpiece for the duration between 5 seconds and 30 minutes. The embedded baking chamber 106 may heat the workpiece at a temperature between 70° C. and a glass transition temperature ($T_g$) of the photoresist on the workpiece. The glass transition temperature ($T_g$) may be at most 150° C. The embedded baking chamber 106 may also heat the workpiece in an ambient environment of clean dry air with an ATM pressure. Heating the workpiece may harden the patterned photoresist on the workpiece to improve stability of the pattern definition, which reduces manufacturing defects for the subsequent pattern transferring process. After the workpiece is heated (e.g., after the heating duration of 5 seconds to 30 minutes), the workpiece may then be cooled down to the room temperature.

In step 314, the workpiece may be transferred from the embedded baking chamber 106 to a loadport 102. In some embodiments, the ATM robot 104 may transfer the workpiece from the embedded baking chamber 106 to the FOUP of the loadport 102 for the next production step. The next production step may be performed by a second semiconductor processing tool different from the semiconductor processing tool 100. The second semiconductor processing tool may be used to perform additional pattern transfer operations (e.g., etching, implantation, or the like). Because the pattern of the patterned photoresist has been stabilized by the heating in step 312 by the semiconductor processing tool 100, the high pattern definition of the patterned photoresist results in improved quality for the second semiconductor processing tool to transfer the pattern of the patterned photoresist to an underlying layer of the semiconductor device. In some embodiments, the hardening process (e.g., heating) is applied by the first semiconductor processing tool only a short time frame (e.g., at most 30 minutes) prior to the pattern transferring process of the second semiconductor processing tool, the patterned photoresist may not have an opportunity to soften (e.g. as a result of moisture absorption) between the hardening process and the pattern transferring process. It has been observed that by limiting the time frame between the annealing process and a pattern transferring process to no more than 30 minutes, softening of the photoresist may be avoided, and manufacturing defects are advantageously reduced.

FIG. 3B illustrates a flow chart of a method 350 of post-baking for embedded baking, in accordance with some embodiments. The method 350 may be performed using the semiconductor processing tool 150 described with respect to FIG. 1B. It should be understood that the embodiment method 350 shown in FIG. 3B is merely an example of many possible embodiment methods. For example, various steps as illustrated in FIG. 3B may be added, removed, replaced, rearranged, and repeated.

In step 352, a workpiece (e.g., a semiconductor wafer or a semiconductor substrate or a flat panel) may be transferred from a loadport 102 to a load-lock 118. The workpiece may be transferred by the ATM robot 104 from the loadport 102 to the load-lock 118.

In step 354, the load-lock 118 may be evacuated to a desired vacuum level. In some embodiments, if the pattern transfer processing chamber 109 is an etching processing chamber for dry etching, the vacuum level for the load-lock 118 may range from about $10^{-3}$ torr to about $10^{-4}$ torr. If the pattern transfer processing chamber 109 is an implantation processing chamber, the vacuum level for the load-lock 118 may range from about $10^{-5}$ torr to about $10^{-6}$ torr.

In step 356, the workpiece may be transferred from the load-lock 118 to the pattern transfer processing chamber 109. In some embodiments, a vacuum robot 110 in the pattern transfer processing chamber 109 may transfer the workpiece from the load-lock 118 and place the workpiece on the platen 112 in the pattern transfer processing chamber 109. Then, the pattern transfer processing chamber 109 may perform pattern transfer operations (e.g., etching, implantation, or the like) on the workpiece to transfer the pattern of the patterned photoresist to an underlying layer of the semiconductor device. For example, the workpiece may be exposed to the ion beam 114 for implantation or certain types of etching.

After the pattern transfer, in step 358, the workpiece may be transferred from the pattern transfer processing chamber 109 to the load-lock 118. In some embodiments, a vacuum robot 110 in the pattern transfer processing chamber 109 may transfer the workpiece from the pattern transfer processing chamber 109 to the load-lock 118.

In step 360, the embedded baking chamber of the load-lock 118 may heat workpiece for the duration between 5 seconds and 30 minutes. Further, the embedded baking chamber of the load-lock 118 may heat the workpiece at a temperature between 70° C. and a glass transition temperature ($T_g$) of the photoresist on the workpiece. The glass transition temperature ($T_g$) may be at most 150° C. Heating the workpiece may harden the patterned photoresist on the workpiece to improve stability of the pattern definition, which reduces manufacturing defects for the subsequent pattern transferring process. After the workpiece is heated, the workpiece may then be cooled down to the room temperature. The load-lock 108 may also be vented to the ATM pressure in this step.

In step 360, the sequence between heating the workpiece and venting the load-lock 118 can be flexible. In some embodiments, the load-lock 118 may first be vented to the ATM pressure. Then, the embedded baking chamber of the load-lock 118 may heat the workpiece in an ambient environment of clean dry air, $N_2$, or an inert gas (e.g., He, Ne, Ar, the like, or combinations thereof) with the ATM pressure. In some other embodiments, the embedded baking chamber of the load-lock 118 may first heat the workpiece under the vacuum pressure level. Then, the load-lock 118 may be vented to the ATM pressure.

In step 362, the workpiece may be transferred from the load-lock 118 to a loadport 102. In some embodiments, the ATM robot 104 may move the workpiece from the load-lock 118 to the FOUP of the loadport 102 for the next production step. The next production step may be performed by a second semiconductor processing tool different from the semiconductor processing tool 150. The second semiconductor processing tool may be used to perform additional pattern transfer operations (e.g., etching, implantation, or the like). Because the pattern of the patterned photoresist has been stabilized by the heating in step 360 by the semiconductor processing tool 150, the high pattern definition of the patterned photoresist results in improved quality for the second semiconductor processing tool to transfer the pattern of the patterned photoresist to an underlying layer of the semiconductor device.

FIGS. 3A and 3B described above illustrate embodiments of post-baking using the embedded baking chamber after the implantation and/or the etching operations that have been performed in the vacuum pattern transfer processing chamber 109. The post-baking techniques described with respect to FIGS. 3A and 3B may be applied as long as the photoresist remains on the workpiece.

Figure 4A:
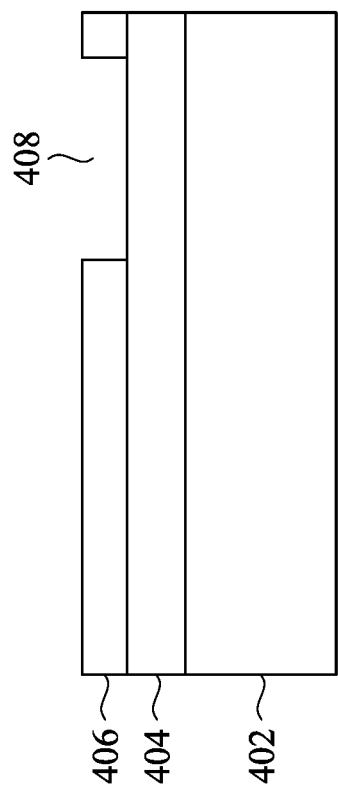
FIGS. 4A through 4F illustrate intermediate steps of creating a semiconductor device, in accordance with some embodiments.

FIGS. 4A through 4F show intermediate steps of creating a semiconductor device where example scenarios of where post-baking may be utilized, according to some embodiments. In FIG. 4A, a hard mask layer 404 may be deposited over a p-type substrate 402 (or a p-type region of a substrate 402). The substrate 402 may be a semiconductor substrate, such as a bulk semiconductor, a semiconductor-on-insulator (SOI) substrate, or the like, which may be doped with a p-type dopant. The substrate 402 may be a wafer, such as a silicon wafer. Other substrates, such as a multi-layered or gradient substrate may also be used. In some embodiments, the semiconductor material of the substrate 402 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. The material for the hard mask layer 404 may include oxide, such as silicon oxide (e.g., $SiO_2$). The hard mask layer 404 may serve as a barrier oxide layer that protects the substrate 402 from contamination during later nitride strip step.

A photoresist 406 may be formed over the hard mask layer 404. The photoresist 406 may be patterned to include openings 408 that correspond to N-wells to be created. The photoresist 406 can be formed by using a spin-on technique and can be patterned using acceptable photolithography techniques.

Figure 4B:
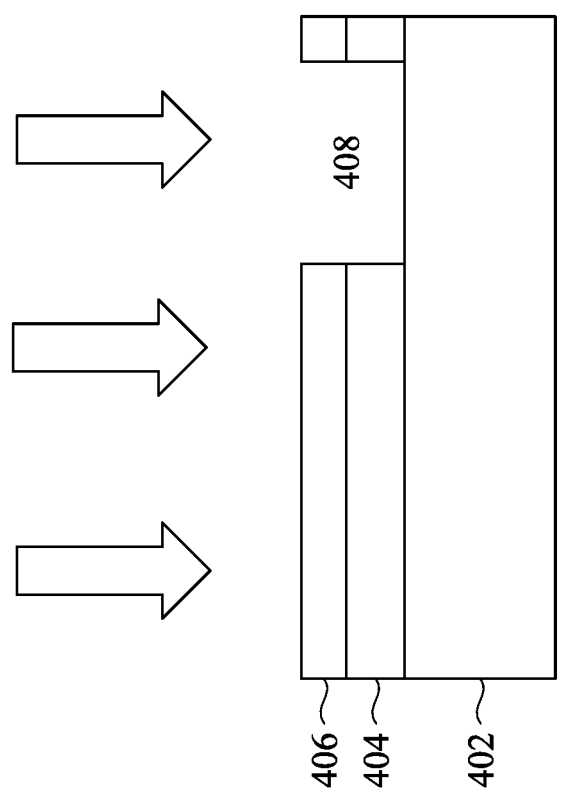

In FIG. 4B, portions of the hard mask layer 404 exposed by the openings 408 may be etched using an acceptable etching process, such as one that is selective to the material of the hard mask layer 404 (e.g., etches the material of the hard mask layer 404 at a faster rate than the material of the p-type substrate 402). After the etching process, the openings 408 may be through the hard mask layer 404 to expose portions of the p-type substrate 402. The etching process may be performed by an etching tool. In some embodiments, the etching tool may be a semiconductor processing tool 100 or 150 with an etching processing chamber 109, described with respect to FIG. 1A or 1B. After the p-type substrate 402 leaves the etching processing chamber 109, post-baking of the p-type substrate 402 may be performed by the embedded baking chamber 106 of the etching tool 100, or by the embedded baking chamber of the load-lock 118 of the etching tool 150, according to the techniques described with respect to FIG. 3A, or FIG. 3B, respectively. After the post-baking in the etching tool 100 or 150, the p-type substrate 402 may be transferred from the etching tool to an implantation tool.

Figure 4C:
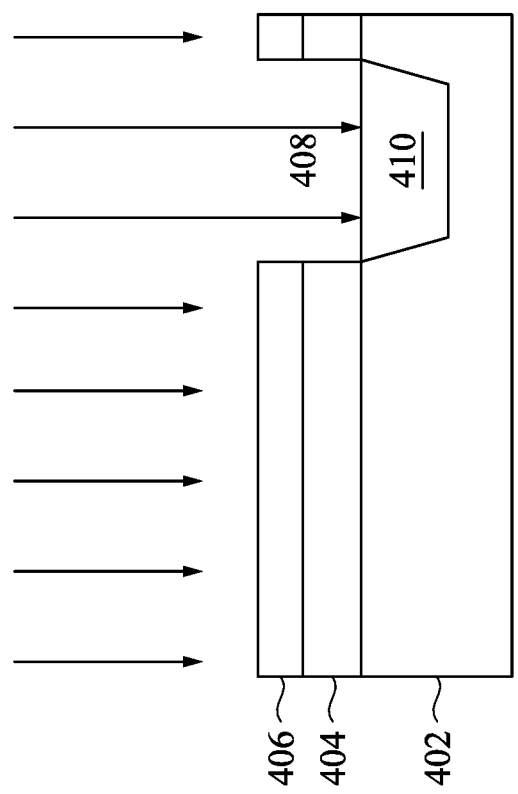

In FIG. 4C, the implantation tool may perform an n-type impurity implantation in the p-type substrate 402 to create N-wells 410. The n-type impurities may be phosphorus, arsenic, antimony, or the like implanted to a concentration in a range from about $10^{13}$ atoms/cm$^3$ to about $10^{14}$ atoms/cm$^3$. In some embodiments, the implantation tool may be another semiconductor processing tool 100 or 150 with an implantation processing chamber 109, described with respect to FIG. 1A or 1B. In some embodiments, after the p-type substrate 402 leaves the implantation processing chamber 109, post-baking of the p-type substrate 402 may be performed by the embedded baking chamber 106 of the etching tool 100, or by the embedded baking chamber of the load-lock 118 of the etching tool 150, according to the techniques described with respect to FIG. 3A, or FIG. 3B, respectively.

Figure 4D:
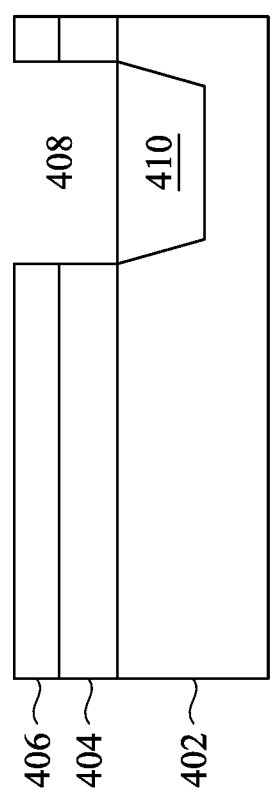

In FIG. 4D, the photoresist 406 may be removed by an acceptable ashing or stripping process, such as using an oxygen plasma or the like. After the photoresist 406 is removed, the substrate may be transferred to a second etching tool different from the etching tool described with respect to FIG. 4B.

Figure 4E:
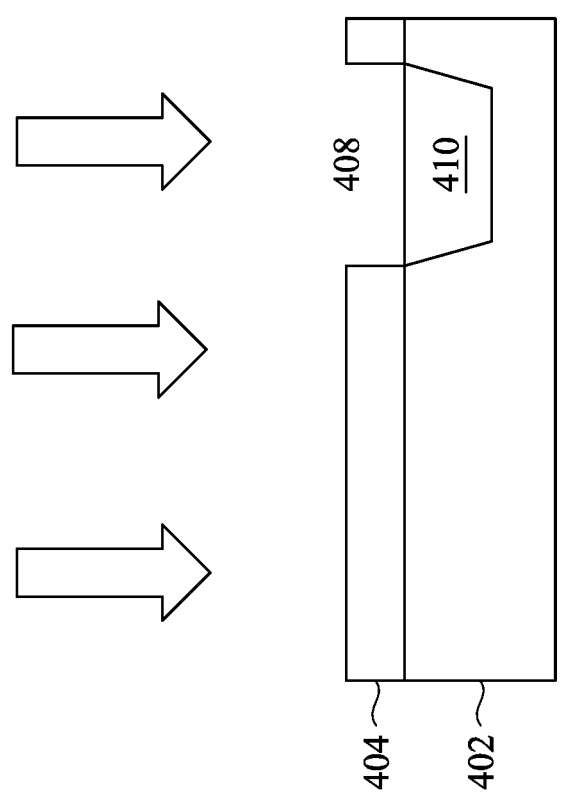
Figure 4F:
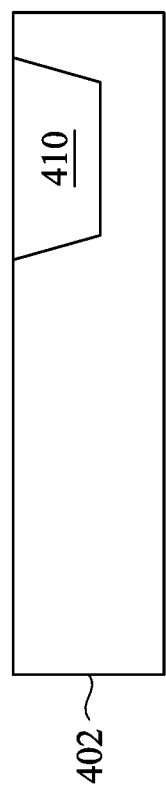

In FIG. 4E, the second etching tool may use another acceptable etching process to remove the hard mask layer 404. The acceptable etching process may be one that is selective to the material of the hard mask layer 404 (e.g., etches the material of the hard mask layer 404 at a faster rate than the material of the p-type substrate 402). Here in FIG. 4E, because there is no photoresist remaining on the p-type substrate 402, the post-baking technique described with respect to FIGS. 3A and 3B are not applicable, and the second etching tool may or may not need to have an embedded baking chamber. After the etching process performed by the second etching tool, the hard mask layer 404 is removed, as shown in FIG. 4F.

FIGS. 4A through 4F illustrate situations of applying post-baking techniques. For example, in FIG. 4B, the photoresist 406 still remains after the etching process. So, post-baking may be applied after the substrate 402 leaves the etching processing chamber 109 of the etching tool. In FIG. 4C, the photoresist 406 also still remains after the implantation process. So, post-baking may be applied after the substrate 402 leaves the implantation processing chamber 109 of the implantation tool. Although FIGS. 4A through 4F describe the situations of utilizing post-baking techniques in the context of forming N-wells, similar principles of utilizing post-baking techniques may be applicable in any other contexts where the photoresist remains after the etching and/or implantation processes.

Various embodiments of pre-baking and post-baking techniques described in this disclosure improve the image quality of the photoresist for pattern transfer. Pre-baking or post-baking may be utilized alone, as described with respect to FIGS. 2A, 2B, 3A, and 3B, in a semiconductor processing tool, as described with respect to FIGS. 1A and 1B. In some embodiments, pre-baking and post-baking may be combined in a semiconductor processing tool. FIGS. 5A and 5B show possible combinations of pre-baking and post-baking, in accordance to some embodiments.

FIG. 5A shows possible combinations of pre-baking and post-baking when the semiconductor processing tool 100 or 150 is an implantation tool. Column 1 shows that an implantation tool 100 or 150 may utilize pre-baking alone to stabilize the photoresist prior to the workpiece entering the implantation processing chamber 109. Column 3 shows that the implantation tool 100 or 150 may utilize post-baking alone to stabilize the photoresist after the workpiece leaving the implantation processing chamber 109 and before being transferred to another processing tool. Column 2 shows that the implantation tool 100 or 150 may utilize pre-baking and post-baking in combination to get the benefits of the both.

FIG. 5B shows possible combinations of pre-baking and post-baking when the semiconductor processing tool 100 or 150 is an etching tool. Column 1 shows that an etching tool 100 or 150 may utilize pre-baking alone to stabilize the photoresist prior to the workpiece entering the etching processing chamber 109. Column 3 shows that the etching tool 100 or 150 may utilize post-baking alone to stabilize the photoresist after the workpiece leaving the etching processing chamber 109. For column 3, in some embodiments, the photoresist may be removed after two separate etching tools. So, post-baking may be also applied by the first etching tool 100 or 150. Because the photoresist is only partly etched by the first etching tool 100 or 150, post-baking may be utilized in the first etching tool 100 or 150 for photoresist stability in the second etching tool. With the first etching tool 100 or 150 performing the post-baking, the second etching tool may or may not need embedding baking. Column 2 shows that the etching tool 100 or 150 may utilize pre-baking and post-baking in combination to get the benefits of the both.

In accordance with embodiments, a semiconductor processing tool includes a pattern transfer processing chamber and a loading area external to the pattern transfer processing chamber and configured to transfer a wafer to or from the pattern transfer processing chamber. The loading area includes a first region including a loadport, a second region between the first region and the pattern transfer processing chamber, and an embedded baking chamber configured to heat a patterned photoresist on the wafer. The second region includes a load-lock. In an embodiment, the pattern transfer processing chamber may include an etching processing chamber or an implantation processing chamber. In an embodiment, the embedded baking chamber may be disposed in the first region, and wherein the first region provides an atmosphere environment. In an embodiment, the first region may further include an atmosphere (ATM) robot configured to transfer the wafer between the loadport and the embedded baking chamber and to transfer the wafer between the embedded baking chamber and the load-lock. In an embodiment, the embedded baking chamber may be embedded in the load-lock in the second region, and the load-lock is configured to transition the wafer from an atmosphere environment to a vacuum environment. In an embodiment, the embedded baking chamber may include a hot plate or a halogen lamp. In an embodiment, the pattern transfer processing chamber may be in a vacuum region at a pressure ranging between $10^{-5}$ to $10^{-6}$ torr.

In accordance with embodiments, a method includes depositing, in a photolithography tool, a photoresist over a device layer of a semiconductor substrate, patterning, in the photolithography tool, the photoresist to provide a patterned photoresist over the semiconductor substrate, and heating, by an embedded baking chamber embedded in a loading area of a pattern transferring tool different from the photolithography tool, the patterned photoresist. The loading area includes a loadport or a load-lock. The method further includes performing, by a pattern transfer processing chamber, a pattern transfer operation on the device layer. In an embodiment, heating the patterned photoresist may include heating, by the embedded baking chamber, the patterned photoresist before performing the pattern transfer operation. In an embodiment, heating the patterned photoresist may include heating, by the embedded baking chamber, the patterned photoresist after performing the pattern transfer operation. In an embodiment, the method may further include performing, by a second pattern transfer processing chamber different from the pattern transfer processing chamber, a second pattern transfer operation on the device layer after heating the patterned photoresist. In an embodiment, the pattern transfer processing chamber may include an etching processing chamber, and the second pattern transfer processing chamber may include an implantation processing chamber. In an embodiment, heating the patterned photoresist may include heating, by the embedded baking chamber, the patterned photoresist for a duration between 5 seconds and 30 minutes, at a temperature between 70° C. and a glass transition temperature ($T_g$), and in an ambient environment of clean dry air, $N_2$, or an inert gas with an atmosphere (ATM) pressure. In an embodiment, performing the pattern transfer operation may include performing, by the pattern transfer processing chamber, an etching operation or an implantation operation on the device layer.

In accordance with embodiments, a semiconductor processing tool includes a pattern transfer processing chamber, a load-lock external to the pattern transfer processing chamber and configured to transfer a wafer to the pattern transfer processing chamber, and a loadport in an atmosphere (ATM) area and external to the pattern transfer processing chamber. The load-lock includes an embedded baking chamber configured to heat a patterned photoresist over the wafer before the wafer is transferred from the load-lock to the pattern transfer processing chamber. The load-lock is between the loadport and the pattern transfer processing chamber. In an embodiment, the semiconductor processing tool may further include an ATM robot configured to transfer the wafer between the loadport and the embedded baking chamber in the load-lock. In an embodiment, the embedded baking chamber may include a hot plate or a halogen lamp. In an embodiment, the pattern transfer processing chamber may include an etching processing chamber or an implantation processing chamber. In an embodiment, the semiconductor processing tool may include a plurality of load-locks including a plurality of embedded heating chambers, and the semiconductor processing tool may further include a plurality of loadports. In an embodiment, the pattern transfer processing chamber may be in a vacuum region at a pressure ranging between $10^{-5}$ torr to $10^{-6}$ torr.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing, in a photolithography tool, a photoresist over a device layer of a semiconductor substrate;
patterning, in the photolithography tool, the photoresist to provide a patterned photoresist over the semiconductor substrate;
heating, by an embedded baking chamber embedded in a loading area of a pattern transferring tool different from the photolithography tool, the patterned photoresist, wherein the loading area includes a loadport or a load-lock; and
performing, by a pattern transfer processing chamber, a pattern transfer operation on the device layer.

2. The method of claim 1, wherein heating the patterned photoresist comprises:
heating, by the embedded baking chamber, the patterned photoresist before performing the pattern transfer operation.

3. The method of claim 1, wherein heating the patterned photoresist comprises:
heating, by the embedded baking chamber, the patterned photoresist after performing the pattern transfer operation.

4. The method of claim 3, further comprising:
after heating the patterned photoresist:
performing, by a second pattern transfer processing chamber different from the pattern transfer processing chamber, a second pattern transfer operation on the device layer.

5. The method of claim 4, wherein the pattern transfer processing chamber comprises an etching processing chamber, and wherein the second pattern transfer processing chamber comprises an implantation processing chamber.

6. The method of claim 1, wherein heating the patterned photoresist comprises:
heating, by the embedded baking chamber, the patterned photoresist for a duration between 5 seconds and 30 minutes, at a temperature between 70° C. and a glass transition temperature (Tg), and in an ambient environment of clean dry air, $N_2$, or an inert gas with an atmosphere (ATM) pressure.

7. The method of claim 1, wherein performing the pattern transfer operation comprises:
performing, by the pattern transfer processing chamber, an etching operation or an implantation operation on the device layer.

8. A method comprising:
loading a workpiece including a patterned photoresist layer into a loading area of a pattern transfer processing chamber, the loading area including an embedded baking chamber, the loading area and the embedded baking chamber being external from the pattern transfer processing chamber, wherein the embedded baking chamber is within an atmospheric space;
heating the workpiece including the patterned photoresist layer in the embedded baking chamber;
applying a first vacuum to the workpiece including the patterned photoresist layer with a load-lock;
transferring the workpiece including the patterned photoresist layer from the load-lock to the pattern transfer processing chamber, wherein the pattern transfer processing chamber has an atmosphere with a second vacuum; and
performing a pattern transfer operation on the workpiece including the patterned photoresist layer within the pattern transfer processing chamber.

9. The method of claim 8, wherein the loading area comprises:
a first region including a loadport, and
a second region between the first region and the pattern transfer processing chamber, the second region including the load-lock.

10. The method of claim 8, wherein the heating the workpiece includes a heating temperature ranging from 70° C. to a glass transition temperature (Tg) of the patterned photoresist layer.

11. The method of claim 10, wherein after heating the workpiece, and before applying the first vacuum to the workpiece, the workpiece cools from an elevated temperature to room temperature.

12. The method of claim 8, wherein the pattern transfer operation comprises an ion implantation, and the first vacuum ranges includes a pressure ranging between $10^{-5}$ torr to $10^{-6}$ torr.

13. The method of claim 8, wherein the pattern transfer operation comprises dry etching, and the first vacuum ranges includes a pressure ranging between $10^{-3}$ torr to $10^{-4}$ torr.

14. The method of claim 8, wherein the heating of the workpiece including the patterned photoresist layer comprises:
heating, by the embedded baking chamber, the workpiece before performing the pattern transfer operation.

15. The method of claim 8, wherein the heating of the workpiece including the patterned photoresist layer comprises:
heating, by the embedded baking chamber, the workpiece after performing the pattern transfer operation.

16. A method comprising:
loading a workpiece including a patterned photoresist layer into a load-lock that is within a load area of a pattern transfer processing chamber, wherein the load area is external from the pattern transfer processing chamber;
heating the workpiece including the patterned photoresist layer in an embedded baking chamber that is present within the load-lock;
applying a first vacuum to the workpiece including the patterned photoresist layer within the load-lock;
transferring the workpiece including the patterned photoresist layer from the load-lock to the pattern transfer processing chamber; wherein the pattern transfer processing chamber has an atmosphere with a second vacuum; and
performing a pattern transfer operation on the workpiece including the patterned photoresist layer within the pattern transfer processing chamber.

17. The method of claim 16, further comprising a loadport in an atmosphere (ATM) area and external to the pattern transfer processing chamber, wherein the load-lock is between the loadport and the pattern transfer processing chamber.

18. The method of claim 16, wherein the embedded baking chamber is configured to heat the patterned photoresist layer over the workpiece before the workpiece is transferred from the load-lock to the pattern transfer processing chamber.

19. The method of claim 16, wherein the pattern transfer operation is ion implantation, and the first vacuum ranges includes a pressure ranging between $10^{-5}$ torr to $10^{-6}$ torr.

20. The method of claim 16, wherein the pattern transfer operation is dry etching, and the first vacuum ranges includes a pressure ranging between $10^{-3}$ torr to $10^{-4}$ torr.

* * * * *